US012695057B2

(12) United States Patent　　　(10) Patent No.:　US 12,695,057 B2
Yoon et al.　　　　　　　　　　　(45) Date of Patent:　　　Jul. 28, 2026

(54) VOLTAGE WAVEFORM CONTROLLING METHOD, SUBSTRATE PROCESSING METHOD, AND SUBSTRATE PROCESSING APPARATUS

(71) Applicant: SAMSUNG ELECTRONICS CO., LTD., Suwon-si (KR)

(72) Inventors: Hyong seo Yoon, Suwon-si (KR);
Hyunbae Kim, Suwon-si (KR);
Yeonguk Kim, Suwon-si (KR);
Yonghee Kim, Suwon-si (KR);
Hyungjun Kim, Suwon-si (KR); Jina Jeon, Suwon-si (KR); Junghyun Cho, Suwon-si (KR); Sungwook Hong, Suwon-si (KR); Wonsub Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 297 days.

(21) Appl. No.: 18/386,931

(22) Filed: Nov. 3, 2023

(65) Prior Publication Data

US 2024/0170255 A1　　May 23, 2024

(30) Foreign Application Priority Data

Nov. 18, 2022　　(KR) ........................ 10-2022-0155796

(51) Int. Cl.
*H01J 37/32*　　　　(2006.01)
(52) U.S. Cl.
CPC .. *H01J 37/32128* (2013.01); *H01J 37/32146* (2013.01); *H01J 37/3299* (2013.01); *H01J 2237/3346* (2013.01)

(58) Field of Classification Search
CPC ........... H01J 37/32128; H01J 37/32146; H01J 37/3299; H01J 2237/3346; H01J 37/32532; H01J 2237/3321; H01J 2237/335
See application file for complete search history.

(56) References Cited

U.S. PATENT DOCUMENTS 10,312,048 B2　6/2019　Dorf et al.
10,685,807 B2　6/2020　Dorf et al.
(Continued)

FOREIGN PATENT DOCUMENTS

KR　10-2020-0086826 A　　7/2020
KR　10-2021-0150603 A　　12/2021
(Continued)

OTHER PUBLICATIONS

Communication dated Apr. 21, 2026, issued by the Korean Ministry of Intellectual Property in Korean Application No. 10-2022-0155796.

*Primary Examiner* — Elmito Breval
(74) *Attorney, Agent, or Firm* — Sughrue Mion, PLLC

(57)　　　　　ABSTRACT

Provided is a voltage waveform control method comprising generating a voltage waveform of a non-sinusoidal wave comprising a pulse period having a positive bias voltage, a ramp period having a negative bias voltage, a first transition period changing from the pulse period to the ramp period, and a second transition period changing from the ramp period to the pulse period, adjusting a length of a negative voltage period having the negative bias voltage during a period of the voltage waveform to be at most 20% of a total length of the period, adjusting a slope of the ramp period, and outputting an adjusted voltage waveform based on the adjusted length of the negative voltage period and the adjusted slope of the ramp period, where the adjusting the
(Continued)

length of the negative voltage period comprises adjusting a length of the first transition period and a length of the second transition period.

19 Claims, 13 Drawing Sheets

(56)                    References Cited

U.S. PATENT DOCUMENTS

| 11,037,806 B2 | 6/2021 | Song et al. |
| 2022/0216036 A1 | 7/2022 | Koshimizu et al. |
| 2023/0072243 A1 | 3/2023 | Kim et al. |

FOREIGN PATENT DOCUMENTS

| KR | 10-2022-0083721 A | 6/2022 |
| KR | 10-2022-0118024 A | 8/2022 |

|  | Intensity 20% | Intensity 30% | Intensity 40% |
|---|---|---|---|
| Selectivity | 4.12 (BEST) | 3.29 | 3.07 |

|  | Gradient 0V | Gradient 500V | Gradient 1000V |
|---|---|---|---|
| IDL | 2.47 | 2.24 (BEST) | 2.82 |

1

VOLTAGE WAVEFORM CONTROLLING METHOD, SUBSTRATE PROCESSING METHOD, AND SUBSTRATE PROCESSING APPARATUS

CROSS-REFERENCE TO RELATED APPLICATION

This application is based on and claims priority under 35 U.S.C. § 119 to Korean Patent Application No. 10-2022-0155796, filed on Nov. 18, 2022 in the Korean Intellectual Property Office, the disclosure of which is incorporated herein by reference in its entirety.

BACKGROUND

The disclosure relates to a voltage waveform controlling method, a substrate processing method, and a substrate processing apparatus, and more specifically, to a control method of a voltage waveform having a pulse period and a ramp period, a substrate processing method, and a substrate processing apparatus.

In a manufacturing process of semiconductor devices, various processes, such as a plasma deposition process, an etching process, and a cleaning process, are used. On the other hand, as semiconductor devices become highly integrated, line widths of patterns in the semiconductor devices are decreasing and aspect ratios of the patterns are increasing. Due to the decrease in the line width and/or the increase in the aspect ratio, the difficulty of the semiconductor device manufacturing process is gradually increasing. Accordingly, a plasma control method for forming a microstructure having a high aspect ratio with high reliability is required.

SUMMARY

The disclosure provides a voltage waveform control method, a substrate processing method, and a substrate processing apparatus, which are capable of improving an etching distribution while improving selectivity of an etching mask.

According to an aspect of the disclosure, there is provided a voltage waveform control method including generating a voltage waveform of a non-sinusoidal wave including a pulse period having a positive bias voltage, a ramp period having a negative bias voltage, a first transition period changing from the pulse period to the ramp period, and a second transition period changing from the ramp period to the pulse period, adjusting a length of a negative voltage period having the negative bias voltage during a period of the voltage waveform of the non-sinusoidal wave to be at most 20% of a total length of the period of the voltage waveform of the non-sinusoidal wave, adjusting a slope of the ramp period, and outputting an adjusted voltage waveform based on the adjusted length of the negative voltage period and the adjusted slope of the ramp period, wherein the adjusting the length of the negative voltage period includes adjusting a length of the first transition period and a length of the second transition period.

A sum of the length of the first transition period and the length of the second transition period may be at most 1.5 times a length of the ramp period.

The length of the first transition period may be adjusted by varying a slope of the first transition period, and the length of the second transition period may be adjusted by varying a slope of the second transition period.

2

An absolute value of a slope of the first transition period may be the same as an absolute value of a slope of the second transition period.

A slope of the ramp period may be adjusted to maintain a constant value for the slope.

The voltage waveform may have a frequency selected from a range of 100 KHz to 1 MHz.

The slope of the ramp period may be a negative slope.

According to another aspect of the disclosure, there is provided a substrate processing method including providing a substrate on a lower electrode structure inside a chamber, the substrate having an etching mask arranged on an upper surface of the substrate, generating plasma in a processing space inside the chamber by applying a plasma voltage to an upper electrode structure, generating a voltage waveform of a non-sinusoidal wave, the voltage waveform including a pulse period having a positive bias voltage, a ramp period having a negative bias voltage, a first transition period changing from the pulse period to the ramp period, and a second transition period changing from the ramp period to the pulse period, adjusting a length of a negative voltage period having the negative bias voltage during a period of the voltage waveform of the non-sinusoidal wave to be at most 20% of a total length of the period of the voltage waveform of the non-sinusoidal wave, adjusting a slope of the ramp period, and applying an adjusted voltage waveform of the adjusted non-sinusoidal wave, based on the adjusted length of the negative voltage period and the adjusted slope of the ramp period, to the lower electrode structure, wherein the adjusting the length of the negative voltage period includes adjusting a length of the first transition period and a length of the second transition period.

A sum of the length of the first transition period and the length of the second transition period may be at most 1.5 times a length of the ramp period.

The length of the first transition period may be adjusted by varying a slope of the first transition period, and the length of the second transition period may be adjusted by varying a slope of the second transition period.

An absolute value of a slope of the first transition period may be the same as an absolute value of a slope of the second transition period.

The length of the first transition period and the length of the second transition period are adjusted based on selectivity of the etching mask with respect to the substrate.

The slope of the ramp period may be adjusted based on a voltage induced to the substrate.

The slope of the ramp period may be adjusted to maintain a voltage induced to the substrate at a constant value.

The slope of the ramp period may be adjusted to maintain a constant value of the slope.

The slope of the ramp period may be a negative slope.

The plasma voltage applied to the upper electrode structure may be a radio frequency (RF) voltage.

The generating the voltage waveform of the non-sinusoidal wave may include determining the positive bias voltage and the negative bias voltage.

The method may further include monitoring the voltage waveform of the non-sinusoidal wave.

According to another aspect of the disclosure, there is provided a substrate processing device including a chamber that includes a processing space, a lower electrode structure arranged in the processing space, and configured to support a substrate, an upper electrode structure arranged to face the lower electrode structure, and configured to generate plasma in the processing space, a plasma voltage supply device configured to apply a plasma voltage to the upper electrode structure, a bias voltage supply device configured to apply a bias voltage to the lower electrode structure, and a control device configured to control an operation of the plasma voltage supply device and an operation of the bias voltage supply device, where the bias voltage supply device is configured to apply, to the lower electrode structure, the bias voltage having a voltage waveform of a non-sinusoidal wave, the bias voltage comprising a pulse period having a positive bias voltage, a ramp period having a negative bias voltage, a first transition period changed from the pulse period to the ramp period, and a second transition period changed from the ramp period to the pulse period, in which a length of a negative voltage period having the negative bias voltage in a period of the voltage waveform is at most 20% of a length of the period.

BRIEF DESCRIPTION OF THE DRAWINGS

Embodiments will be more clearly understood from the following detailed description taken in conjunction with the accompanying drawings in which:

FIGS. 3A and 3B are graphs of voltage waveforms of a non-sinusoidal wave, according to embodiments;

FIG. 7 is a graph of voltage waveforms of non-sinusoidal waves having different negative voltage period lengths;

DETAILED DESCRIPTION OF THE EMBODIMENTS

Figure 1:
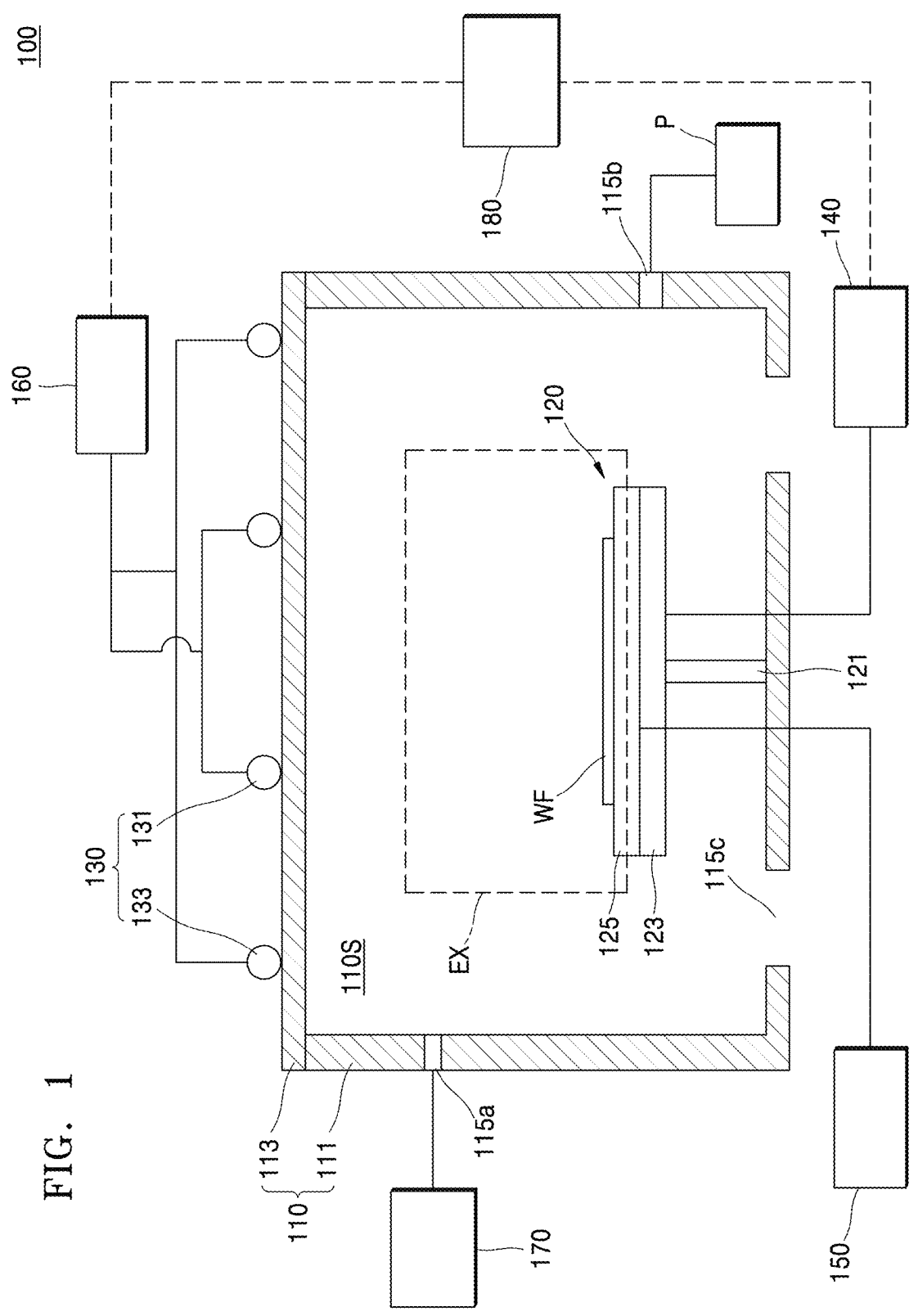
FIG. 1 is a block diagram of a substrate processing apparatus according to an embodiment.

Hereinafter, embodiments of the disclosure are described in detail with reference to the accompanying drawings. Identical reference numerals are used for the same constituent elements in the drawings, and duplicate descriptions thereof are omitted.

FIG. 1 is a block diagram of a substrate processing apparatus 100 according to an embodiment.

Referring to FIG. 1, the substrate processing apparatus 100 may be configured to perform a plasma process on a substrate WF. The plasma process may include, for example, an etching process, a deposition process, a cleaning process, etc. In an embodiment, the substrate processing apparatus 100 may include an inductively coupled plasma (ICP) facility. However, the embodiment is not limited thereto, and the substrate processing apparatus 100 may also include a capacitive coupled plasma (CCP) facility, an electron cyclotron resonance (ECR) plasma facility, or a helical plasma facility.

The substrate processing apparatus 100 may include a chamber 110, a lower electrode structure 120, an upper electrode structure 130, a bias voltage supply device 140, an electrostatic chuck voltage supply device 150, a plasma voltage supply device 160, a gas supply device 170, and a control device 180.

The chamber 110 may provide a processing space 110S in which a plasma processing on the substrate WF is performed. The chamber 110 may include a vacuum chamber having a cylindrical shape. The chamber 110 may include a material, such as aluminum and stainless steel. The chamber 110 may include a lower chamber 111 and an upper chamber 113.

The lower chamber 111 may include a gas supply port 115a on one sidewall thereof. Various types of process gases supplied by the gas supply device 170 may be supplied into the lower chamber 111 via the gas supply port 115a. The process gas may also include, for example, a plasma gas for generating plasma, or a deposition gas for performing a deposition process. In addition, the lower chamber 111 may include a pump port 115b on the other sidewall thereof. The pump port 115b may be connected to a vacuum pump P, and the vacuum pump P may maintain the atmosphere of the processing space 110S of the chamber 110 in a vacuum state via the pump port 115b. In FIG. 1, the lower chamber 111 is illustrated as including the gas supply port 115a on one sidewall thereof and the pump port 115b on the other sidewall thereof facing the one sidewall, but the lower chamber 111 is not limited thereto. For example, the lower chamber 111 may also include both the gas supply port 115a and the pump port 115b on the same sidewall thereof. The lower chamber 111 may include an exhaust port 115c on a bottom surface thereof. The exhaust port 115c may be connected to an exhaust device (not illustrated), and the exhaust device may exhaust airflow in the processing space 110S to the outside of the processing space 110S via the exhaust port 115c.

The upper chamber 113 may be arranged on the lower chamber 111. The upper chamber 113 may include a disk-shaped dielectric window. The lower chamber 111 and the upper chamber 113 may include the same material. For example, the lower chamber 111 and the upper chamber 113 may include aluminum.

The lower electrode structure 120 may be arranged in the processing space 110S in the chamber 110. The lower electrode structure 120 may include a lower driving device 121, a lower electrode 123, and an electrostatic chuck 125.

The lower driving device 121 may be configured to vertically move the lower electrode 123 and the electrostatic chuck 125. The lower driving device 121 may include, for example, a motor. The lower electrode 123 may be arranged on the lower driving device 121. The lower electrode 123 may function as an electrode to which a bias voltage is applied. By applying a bias voltage to the lower electrode 123, plasma ions generated in the processing space 110S may be incident on the substrate WF supported by the electrostatic chuck 125. The lower electrode 123 may have, for example, a disk shape. The electrostatic chuck 125 may be arranged on the lower electrode 123. The electrostatic chuck 125 may be configured to receive a voltage supplied by the electrostatic chuck voltage supply device 150, and support the substrate WF by using an electrostatic force. The electrostatic chuck 125 may include a heater (not illustrated) for controlling the temperature therein. The heater may be configured to heat the substrate WF supported by the electrostatic chuck 125. The electrostatic chuck 125 may have a disk shape. In an embodiment, the lower electrode 123 and the electrostatic chuck 125 may have the same shape. For example, the lower electrode 123 and the electrostatic chuck 125 may include upper surfaces having an identical diameter and a disk shape. In this case, the diameter of the upper surface of the lower electrode 123 and the diameter of the upper surface of the electrostatic chuck 125 may be greater than the diameter of the substrate WF.

The upper electrode structure 130 may be arranged on the chamber 110 to face the lower electrode structure 120. The upper electrode structure 130 may be arranged on the outer upper portion of the upper chamber 113 so that the upper electrode structure 130 faces the lower electrode 123 of the lower electrode structure 120. The upper electrode structure 130 may include an inner coil 131 and an outer coil 133. The inner coil 131 and the outer coil 133 may have a spiral shape or a concentric circle shape. The inner coil 131 and the outer coil 133 may receive a plasma voltage, and generate plasma in the processing space 110S. Although FIG. 1 illustrates that two inner coils 131 and two outer coils 133 are provided, the embodiment is not limited thereto, and for example, three inner coils 131 and three outer coils 133 may be provided. In addition, in FIG. 1, the inner coil 131 and the outer coil 133 are illustrated to be arranged only on the outer upper portion of the upper chamber 113, but the embodiment is not limited thereto, and the inner coil 131 and the outer coil 133 may also be arranged outside both sidewalls of the lower chamber 111.

The bias voltage supply device 140 may apply a bias voltage waveform having a non-sinusoidal wave to the lower electrode 123. In an embodiment, the bias voltage having the voltage waveform of the non-sinusoidal wave may have a certain frequency selected in a range of 100 KHz to 1 MHz. For example, the bias voltage may have a frequency of 400 KHz. Hereinafter, with reference to FIGS. 1, 2, 3A, and 3B together, the bias voltage supply device 140 and a bias voltage having a voltage waveform of a non-sinusoidal wave applied to the lower electrode structure 120 by the bias voltage supply device 140 are described in more detail.

Figure 2:
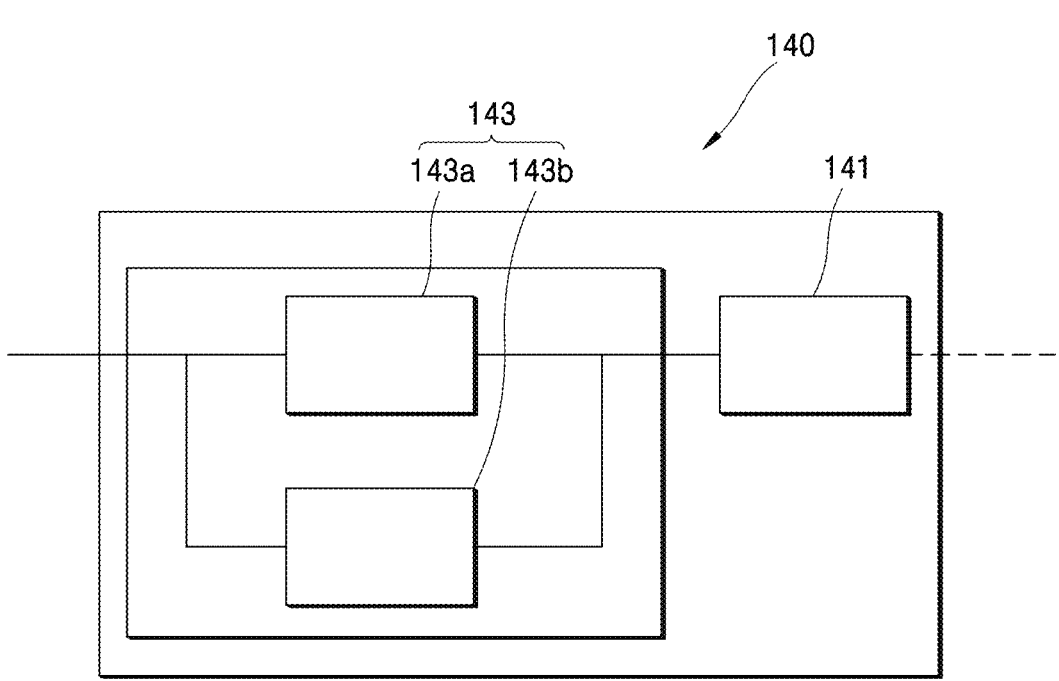
FIG. 2 is a block diagram of a bias voltage supply device included in a substrate processing apparatus, according to an embodiment.
Figure 3A:
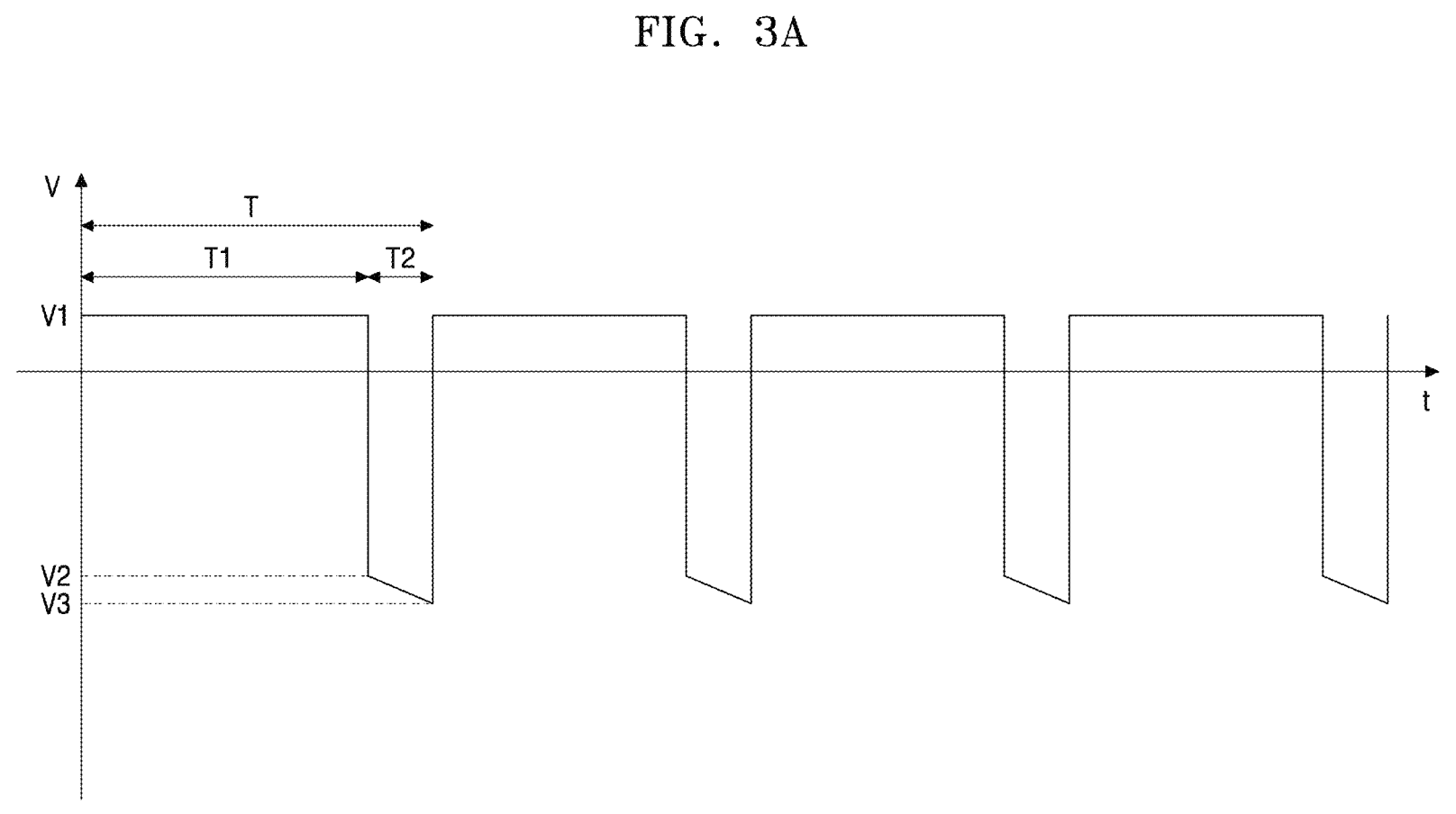
Figure 3B:
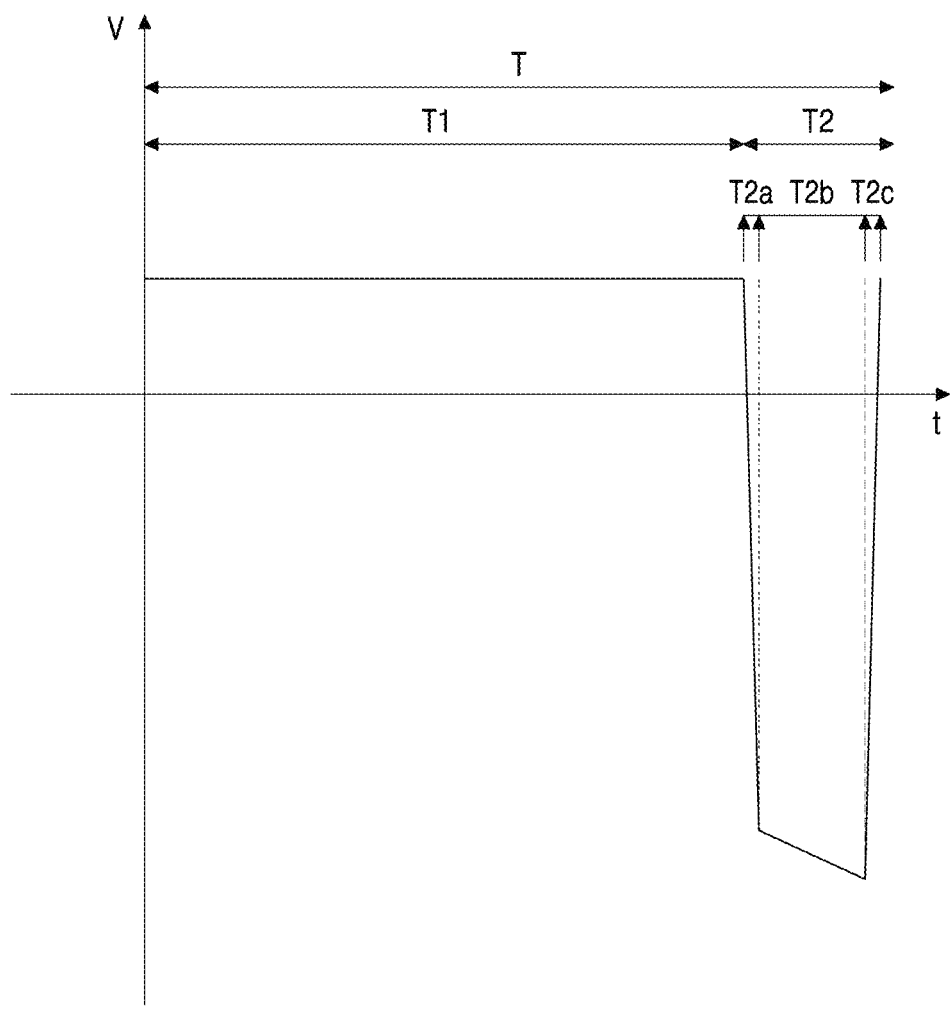

FIG. 2 is a block diagram of the bias voltage supply device 140 included in the substrate processing apparatus 100, according to an embodiment. FIGS. 3A and 3B are graphs of voltage waveforms of a non-sinusoidal wave, according to embodiments. FIG. 3A is a graph of a voltage waveform of a non-sinusoidal wave, and FIG. 3B is a graph of one period T of the voltage waveform illustrated in FIG. 3A.

Referring to FIGS. 1, 2, 3A, and 3B together, the bias voltage supply device 140 may include a direct current (DC) power generator 141 and a modulator 143. The DC power generator 141 may generate a DC voltage, and supply the DC voltage to the modulator 143. The modulator 143 may include any power element switches. The modulator 143 may control the DC voltage supplied by the DC power generator 141 via the power element switches and generate a bias voltage having a voltage waveform of a non-sinusoidal wave, and apply the bias voltage to the lower electrode 123. The modulator 143 may generate a bias voltage having a voltage waveform of a non-sinusoidal wave, in which a value of a positive voltage V1 in a pulse period T1, values of negative voltages V2 and V3 in a ramp period T2b, and a slope value of the ramp period T2b are adjusted, and apply the generated bias voltage to the lower electrode 123.

The modulator 143 may include a pulse adjustment unit 143a and a ramp adjustment unit 143b. The pulse adjustment unit 143a may include arbitrary pulse control switches, and the ramp adjustment unit 143b may include arbitrary ramp control switches. The pulse adjustment unit 143a and the ramp adjustment unit 143b may generate a bias voltage having a voltage waveform of a non-sinusoidal wave by selectively turning on and off the pulse control switches and the ramp control switches together.

The voltage waveform of a non-sinusoidal wave generated by the modulator 143 may have one period T corresponding to one frequency, and the one frequency may be changed. For example, when the voltage waveform of a non-sinusoidal wave has a frequency of 400 KHz, the one period T of the voltage waveform of the non-sinusoidal wave may be 2500 nanoseconds.

The voltage waveform of the non-sinusoidal wave may, in one period T, have the pulse period T1 having a positive voltage V1 and a negative voltage period T2 having negative voltages V2 and V3. Hereinafter, the pulse period T1 may include a period having a constant amount of voltage V1, and may be referred to as a positive voltage period.

The negative voltage period T2 may include a first transition period T2a, the ramp period T2b, and a second transition period T2c. The ramp period T2b may include a period where the voltage decreases at a certain slope. Accordingly, the ramp period T2b may include a period where a first negative voltage V2 is reduced at a constant slope, and become a second negative voltage V3. The first transition period T2a may include a period where the pulse period T1 is changed to the ramp period T2b. The second transition period T2c may include a period where the ramp period T2b is changed to the pulse period T1. In FIGS. 3A and 3B, the first transition period T2a and the second transition period T2c are illustrated to have positive voltages in some portions thereof, but this is for convenience of description, and a period having a positive voltage among the first transition period T2a and the second transition period T2c may be much shorter than a period having a negative voltage among the first and second transition periods T2a and T2c, and may be ignored. Accordingly, the first transition period T2a and the second transition period T2c may be referred to as the negative voltage period T2 together with the ramp period T2b.

In an embodiment, the bias voltage supply device 140 may adjust the voltage waveform so that the length of the negative voltage period T2 within the one period T is 20% or less of the total length of the one period T. In other words, the bias voltage supply device 140 may adjust the voltage waveform so that an application time of the negative voltage period T2 is about 20% or less of the one period T. For example, when the one period T is about 2500 nanoseconds, the negative voltage period T2 may be about 500 nanoseconds. In an embodiment, the length of the negative voltage period T2 may be about 10% to about 20% of the length of the one period T.

In an embodiment, the absolute value of the positive voltage V1 may be a certain value selected in a range of 0 to 600. In an embodiment, the absolute value of the first negative voltage V2 may be a value selected in a range of 0 to 1000. In an embodiment, the absolute value of the second negative voltage V3 may be a value selected from a range of 0 to 100.

In an embodiment, the ratio of the absolute value of the positive voltage V1 over the sum of the absolute value of the first negative voltage V2 and the absolute value of the second negative voltage V3 may be about 1:2 to about 1:5. For example, the absolute value of the positive voltage V1 may be about 300, and the sum of the absolute value of the first negative voltage V2 and the absolute value of the second negative voltage V3 may be about 900.

Referring to FIG. 1 again, the electrostatic chuck voltage supply device 150 may be configured to supply a DC voltage to the electrostatic chuck 125. A DC voltage may be supplied to the electrostatic chuck 125 by the electrostatic chuck voltage supply device 150, and the substrate WF may be supported by the electrostatic chuck 125.

The plasma voltage supply device 160 may apply a plasma voltage to the upper electrode structure 130. The plasma voltage may include, for example, a radio frequency (RF) voltage. The plasma voltage may have, for example, a frequency of about 13.56 MHz. The plasma voltage supply device 160 may include an RF power source (not illustrated) and an RF matcher (not illustrated). The RF power source may generate an RF signal, and the RF matcher may control plasma generated in the processing space 110S by matching an impedance of the RF signal generated by the RF power source.

The gas supply device 170 may be configured to supply a process gas to the processing space 110S in the chamber 110. The gas supply device 170 may include a plurality of gas supply lines (not illustrated) and a plurality of mass flow controllers (MFCs) (not illustrated). The plurality of MFCs may independently control each of the corresponding plurality of gas supply lines. Each of the plurality of gas supply lines may be configured to supply different process gases. For example, the plurality of gas supply lines may include two gas supply lines, one of the two gas supply lines may supply plasma gas, and the other of the two gas supply lines may supply inert gas.

The control device 180 may be configured to control an operation of the bias voltage supply device 140 and an operation of the plasma voltage supply device 160. The control device 180 may control the operation of the bias voltage supply device 140 by outputting the bias voltage control signal to the bias voltage supply device 140, and may control the operation of the plasma voltage supply device 160 by outputting the plasma voltage control signal to the plasma voltage supply device 160.

The control device 180 may be implemented as hardware, firmware, software, or a combination thereof. For example, the control device 180 may include a computing device, such as a workstation computer, a desktop computer, a laptop computer, and a tablet computer. For example, the control device 180 may include a memory device, such as read only memory (ROM) and random access memory (RAM), and a processor configured to perform certain operations and algorithms, such as a microprocessor, a central processing unit (CPU), and a graphics processing unit (GPU).

In FIG. 1, the control device 180 is illustrated to be outside the bias voltage supply device 140 and the plasma voltage supply device 160, but is not limited thereto. For example, the substrate processing apparatus 100 may include a plurality of control devices, and the plurality of control devices may also be inside the bias voltage supply device 140 and inside the plasma voltage supply device 160.

The substrate processing apparatus 100 according to an embodiment may include the bias voltage supply device 140 configured to adjust the voltage waveform so that the length of the negative voltage period T2 within the one period T is less than 20% of the total length of the one period T. By controlling the length of the negative voltage period T2, an ion flux of plasma ions incident on the substrate WF may be adjusted, and accordingly, may improve the selectivity of the etching mask.

Figure 4:
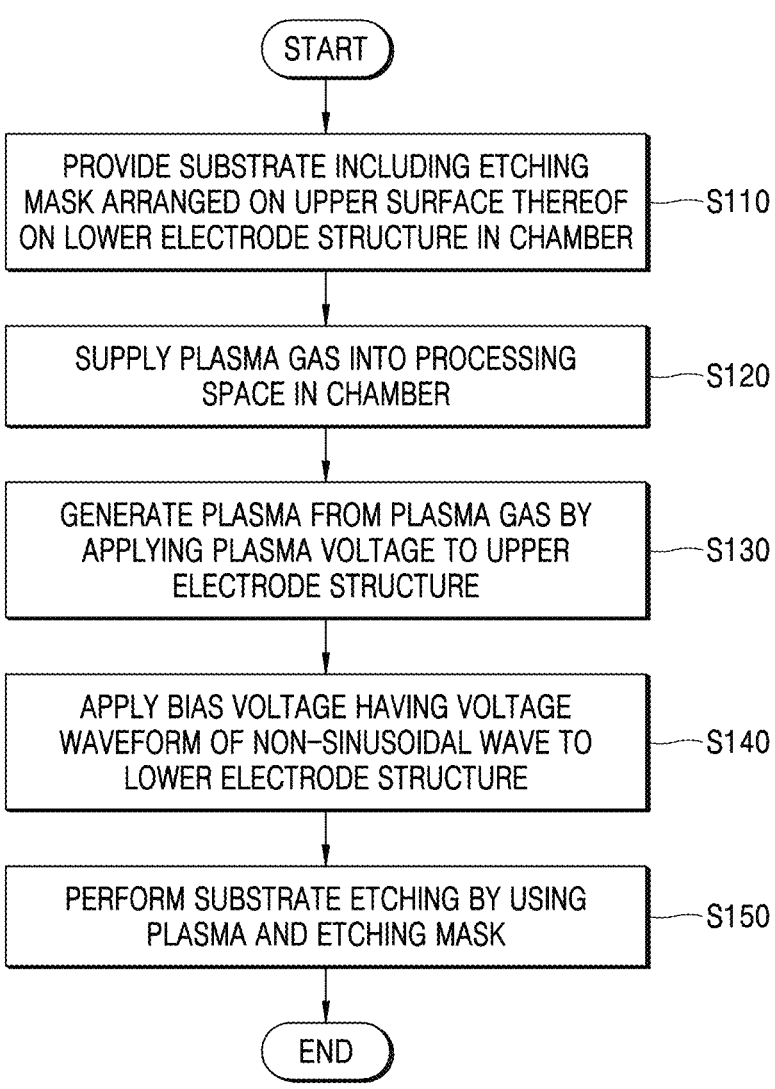
FIG. 4 is a flowchart of a substrate processing method according to an embodiment.
Figure 5:
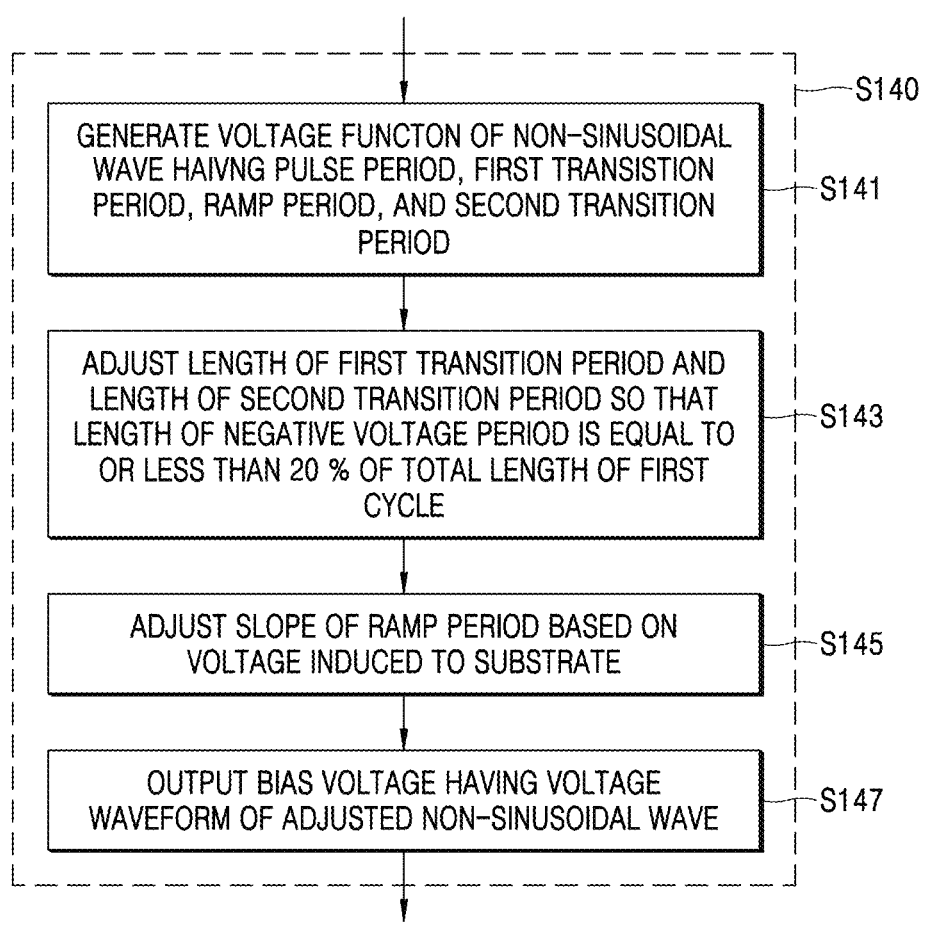
FIG. 5 is a flowchart of a method of generating and applying a bias voltage having a voltage waveform of a non-sinusoidal wave, according to an embodiment.
Figure 6A:
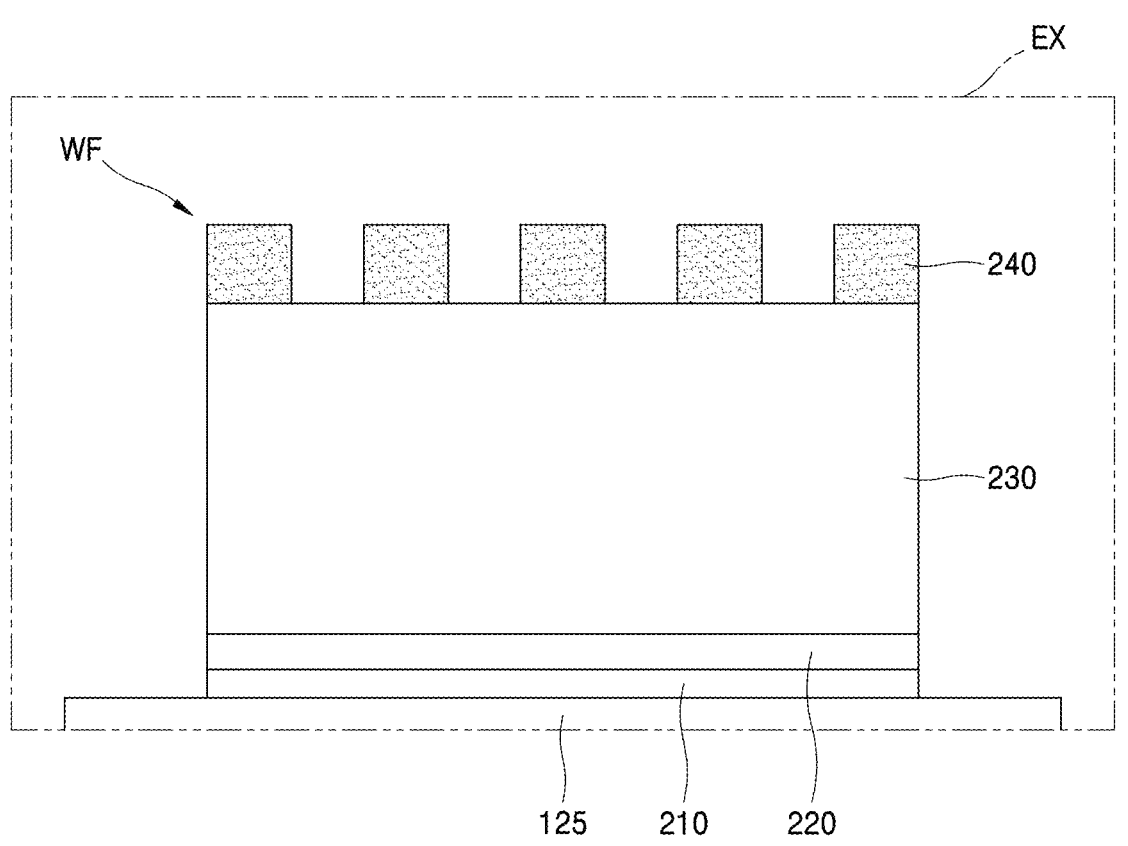
FIGS. 6A and 6B are cross-sectional views of operations of a substrate processing method, according to embodiments.
Figure 6B:
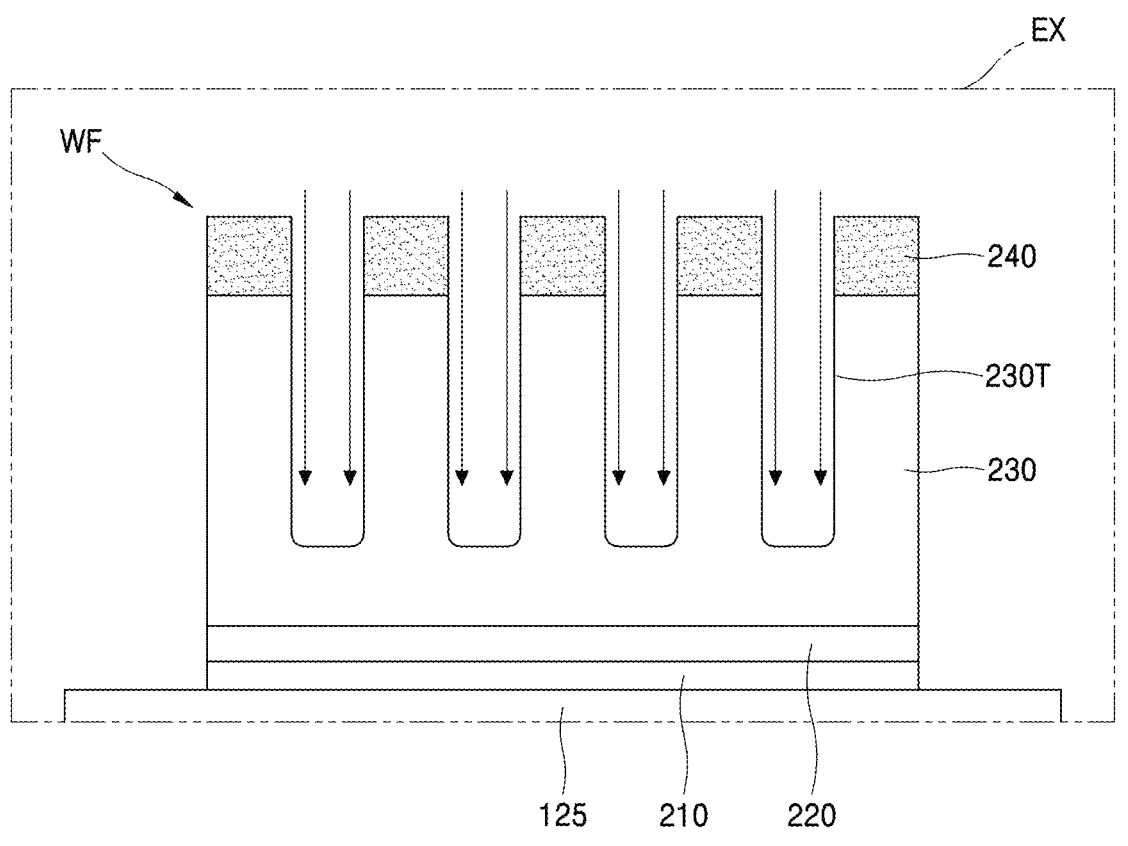

FIG. 4 is a flowchart of a substrate processing method according to an embodiment. FIG. 5 is a flowchart of a method of generating and applying a bias voltage having a voltage waveform of a non-sinusoidal wave, according to an embodiment. FIGS. 6A and 6B are cross-sectional views of operations of the substrate processing method, according to embodiments.

Referring to FIGS. 1, 4, and 6A together, firstly, the substrate WF may be provided on the electrostatic chuck 125 of the lower electrode structure 120 (S110). The substrate WF may include a semiconductor substrate 210, a thin layer 220 on the semiconductor substrate 210, and an etching target layer 230 on the thin layer 220. Unlike as illustrated in FIG. 6A, the thin layer 220 and/or the etching target layer 230 may also be omitted. In an embodiment, prior to operation S110, after the thin layer 220 and the etching target layer 230 are sequentially formed on the semiconductor substrate 210, the substrate WF may also be provided on the electrostatic chuck 125, or after the semiconductor substrate 210 is provided on the electrostatic chuck 125, the thin layer 220 and the etching target layer 230 may also be sequentially formed on the semiconductor substrate 210. An etching mask 240 for forming a semiconductor pattern may be arranged on the etching target layer 230.

Next, referring to FIGS. 1 and 4, plasma gas may be supplied to the processing space 110S in the chamber 110 (S120). The plasma gas may be supplied to the processing space 110S by the gas supply device 170. Next, a plasma voltage may be applied to the upper electrode structure 130 by the plasma voltage supply device 160 (S130). As the plasma voltage is applied to the upper electrode structure 130, plasma may be generated from the plasma gas in the processing space 110S.

Next, referring to FIGS. 1, 3A, 3B, and 4, the bias voltage supply device 140 may generate a bias voltage having a voltage waveform of a non-sinusoidal wave illustrated in FIGS. 3A and 3B, and apply the bias voltage to the lower electrode structure 120 (S140). Next, the bias voltage may be applied to the lower electrode structure 120, the plasma ions generated in the processing space 110S may enter the substrate WF, an etching process may be performed by the plasma ions, and then a pattern 230T may be formed on the substrate WF (S150). In an embodiment, after operation S140, an operation of monitoring a voltage waveform of a non-sinusoidal wave may be further included. During the monitoring operation, the voltage waveform of a non-sinusoidal wave may be adjusted according to process conditions.

Referring to FIGS. 4 and 5, in operation S140, first, the DC power generator 141 of the bias voltage supply device 140 may generate a DC voltage and supply the DC voltage to the modulator 143 (S141).

Next, the modulator 143 may adjust the voltage waveform so that the length of the negative voltage period T2 within one period T of the voltage waveform is 20% or less of the total length of the one period T (S143). For example, the modulator 143 may adjust the voltage waveform so that the length of the negative voltage period T2 within one period T of the voltage waveform is about 10% to 20% of the total length of the one period T. In an embodiment, the modulator 143 may adjust the voltage waveform so that the length of the negative voltage period T2 is 20% or less of the total length of the one period T, by adjusting the total length of the first transition period T2a and the second transition period T2c. By controlling the length of the negative voltage period T2, an ion flux of plasma ions incident on the substrate WF may be adjusted, and accordingly, the selectivity of the etching mask may be improved.

In an embodiment, the modulator 143 may adjust the length of the first transition period T2a by adjusting the slope of the first transition period T2a, and adjust the length of the second transition period T2c by adjusting the slope of the second transition period T2c. In an embodiment, the modulator 143 may adjust the slope of the first transition period T2a and the slope of the second transition period T2c so that the absolute value of the slope of the first transition period T2a and the absolute value of the slope of the second transition period T2c are the same.

In an embodiment, the modulator 143 may adjust length of the first transition period T2a and the length of the second transition period T2c so that the sum of the length of the first transition period T2a and the length of the second transition period T2c is 1.5 times or less the length of the ramp period T2b. For example, the modulator 143 may adjust the length of the first transition period T2a and the length of the second transition period T2c so that the sum of the length of the first transition period T2a and the length of the second transition period T2c is about 0.5 times to about 1.5 times the length of the ramp period T2b. In the negative voltage period T2, by adjusting the sum of the length of the first transition period T2a and the length of the second transition period T2c to 1.5 times or less the length of the ramp period T2b, the length of the ramp period T2b, in which a negative voltage is maintained, may be secured as equal to or greater than a certain level, and accordingly, an etching process on the substrate WF may be smoothly performed.

In an embodiment, the modulator 143 may adjust length of the first transition period T2a and the length of the second transition period T2c based on the selectivity of the etching mask 240 with respect to the etching target layer 230. For example, the modulator 143 may adjust the length of the first transition period T2a and the length of the second transition period T2c so that the selectivity of the etching mask 240 with respect to the etching target layer 230 increases.

Next, the modulator 143 may adjust the slope of the ramp period T2b (S145). In an embodiment, the modulator 143 may adjust the slope of the ramp period T2b so that the slope of the ramp period T2b is a negative slope. In an embodiment, the modulator 143 may adjust the slope of the ramp period T2b so that the slope of the ramp period T2b is maintained constant.

In an embodiment, the modulator 143 may adjust the slope of the ramp period T2b based on the voltage induced to the substrate WF. The modulator 143 may adjust the slope of the ramp period T2b so that the voltage induced to the substrate WF maintains a constant value. By adjusting the slope of the ramp period T2b so that the voltage induced to the substrate WF maintains a constant value, the plasma ions in the processing space 110S may be distributed in a narrow ion energy region. Accordingly, the ion energy of each of the plasma ions may be relatively constant, and thus, the etching distribution may be improved in the etching process using the plasma ions.

In the substrate processing method according to an embodiment of the disclosure, the voltage waveform may be adjusted so that the length of the negative voltage period T2 is less than 20% of the total length of the one period T within one period T of the voltage waveform, and by applying the bias voltage having the voltage waveform to the lower electrode, an etching process may be performed on the substrate WF. By controlling the length of the negative voltage period T2, an ion flux of plasma ions incident on the substrate WF may be adjusted, and accordingly, the selectivity of the etching mask may be improved. In addition, the substrate processing method according to an embodiment of the disclosure may generate a voltage waveform by adjusting the slope of the ramp period T2b included in the negative voltage period T2 so that the voltage induced to the substrate WF remains a constant value, and perform an etching process on the substrate WF by applying the bias voltage having the voltage waveform to the lower electrode. Accordingly, the plasma ions in the processing space 110S may be distributed in the narrow ion energy region, so that the ion energy of each of the plasma ions is maintained relatively constant. Accordingly, etching distribution may be improved in the etching process using the plasma ions. Hereinafter, the effects of the length adjustment of the negative voltage period T2 and the slope adjustment of the ramp period T2b are described in more detail with reference to FIGS. 7 through 11B.

Figure 7:
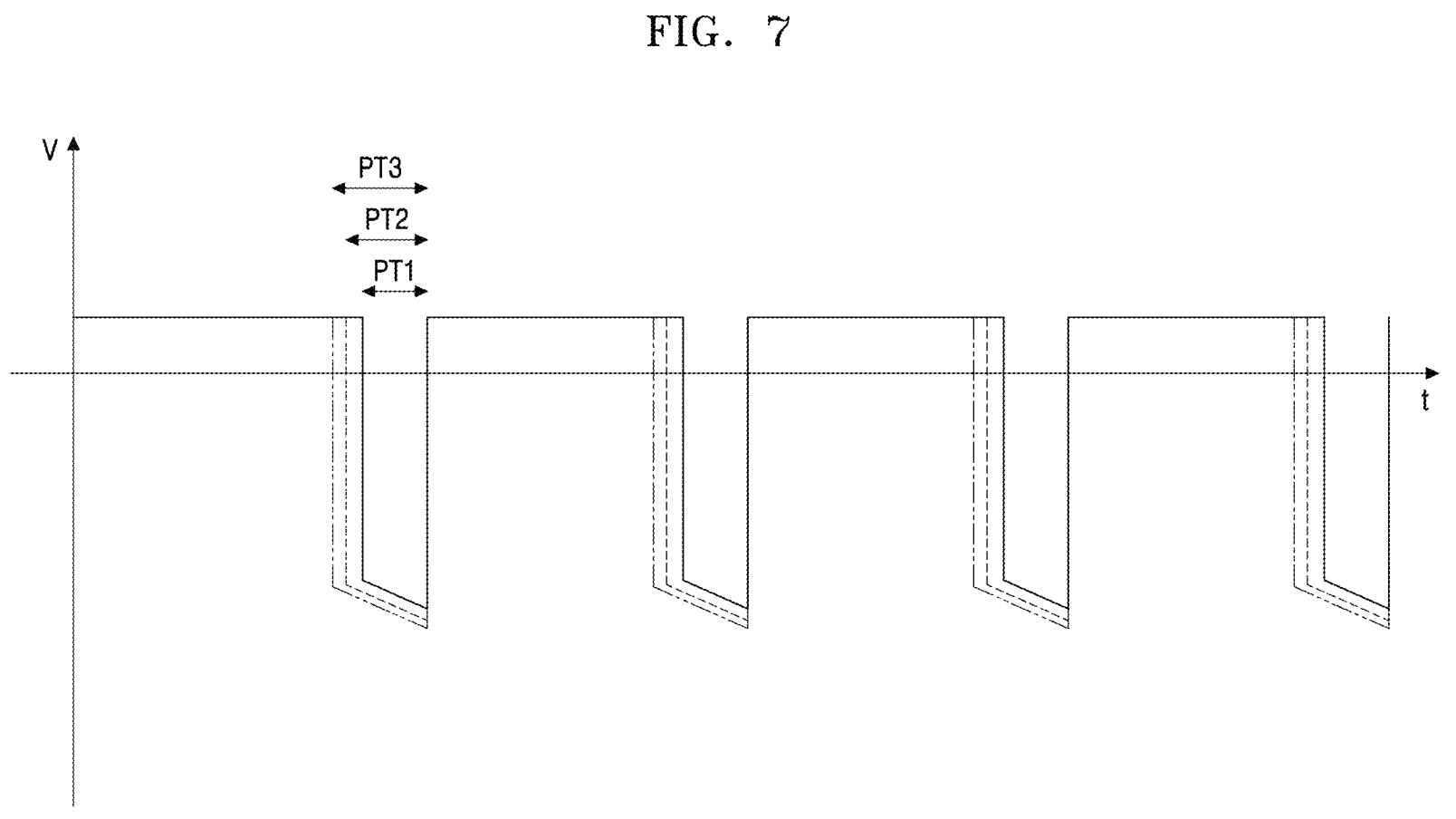
Figures 8A, 8B:
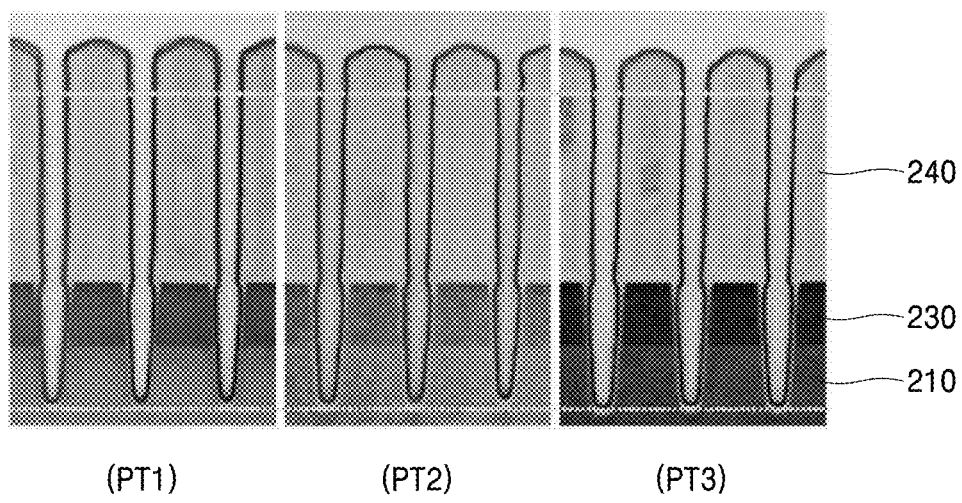
FIG. 8A illustrates results of performing an etching process by applying bias voltages of voltage waveforms in FIG. 7, according to an embodiment.
FIG. 8B is a table of etching mask selectivity of each case in FIG. 8A, according to an embodiment.

FIG. 7 is a graph of voltage waveforms of non-sinusoidal waves having different negative voltage period lengths. FIG. 7 illustrates a first case PT1, in which the length of the negative voltage period T2 of the voltage waveform of a non-sinusoidal wave is 20% of the total length of the one period T, a second case PT2, in which the length of the negative voltage period T2 of the voltage waveform of a non-sinusoidal wave is 30% of the total length of the one period T, and a third case PT3. in which the length of the negative voltage period T2 of the voltage waveform of a non-sinusoidal wave is 40% of the total length of the one period T. FIG. 8A illustrates results of performing an etching process by applying the bias voltages of the voltage waveforms in FIG. 7, according to an embodiment. FIG. 8B is a table of etching mask selectivity of each case in FIG. 8A, according to an embodiment. The substrate WF etched in FIG. 8A may include the semiconductor substrate 210 and the etching target layer 230, and an etching mask 240 may be arranged on the substrate WF.

Referring to FIGS. 7, 8A, and 8B, as the ratio of the length of the negative voltage period to the total length of one period of the voltage waveform increases (that is, from the first case PT1 to the second case PT2 and from the case period PT2 to the third case PT3), the selectivity of the etching mask with respect to the etching target layer may be identified to degrade (that is, from 4.12 to 3.29 and from 3.29 to 3.07). Based on the results described above, it may be identified that by adjusting a length of a negative voltage period of a voltage waveform to be equal to or less than 20% of the total length of one cycle, the selectivity of an etching mask is improved in an etching process performed on a substrate by applying a bias voltage having the voltage waveform.

Figure 9:
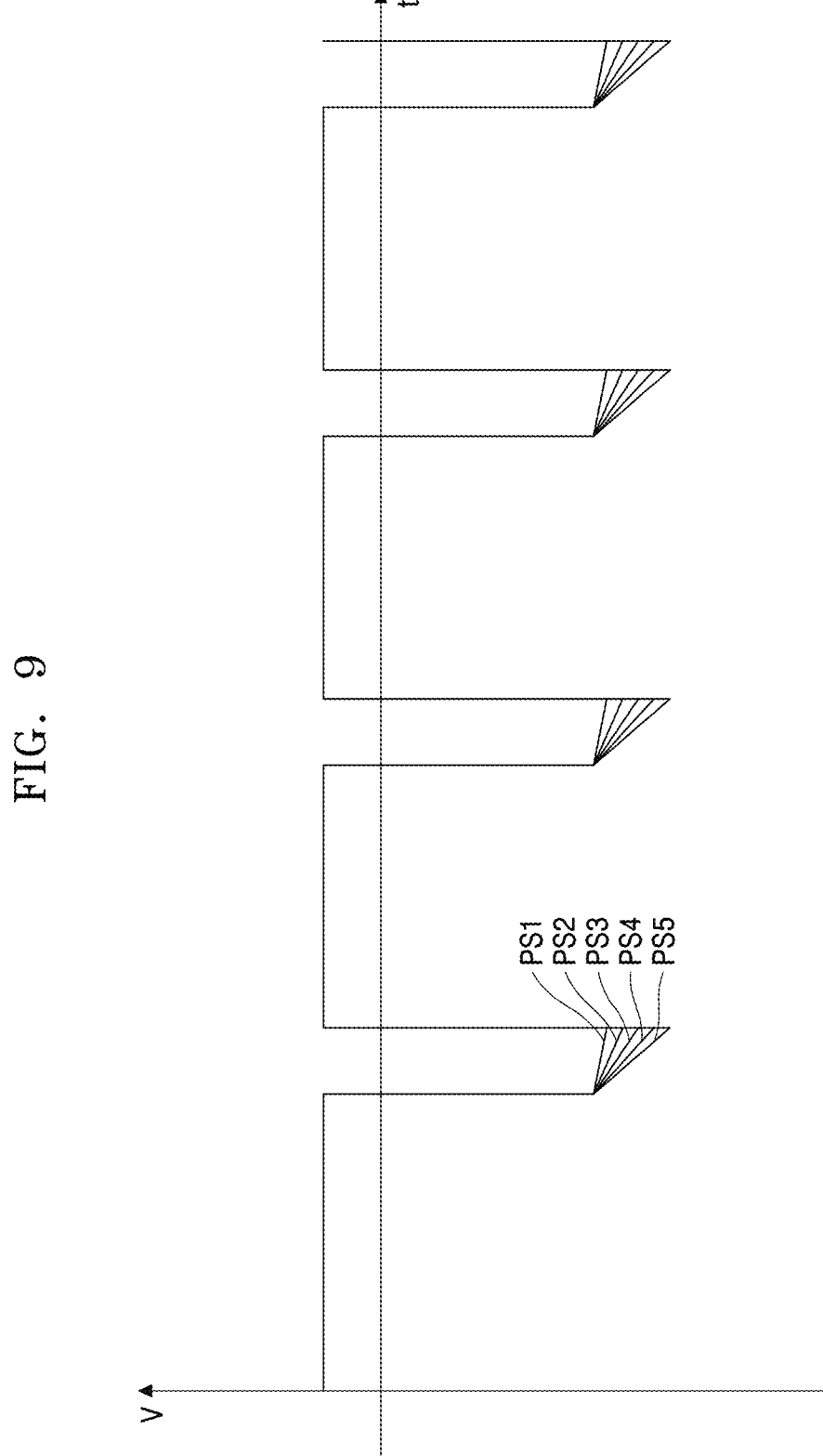
FIG. 9 is a graph of voltage waveforms of non-sinusoidal waves having different slopes in a ramp period, according to an embodiment.
Figure 10:
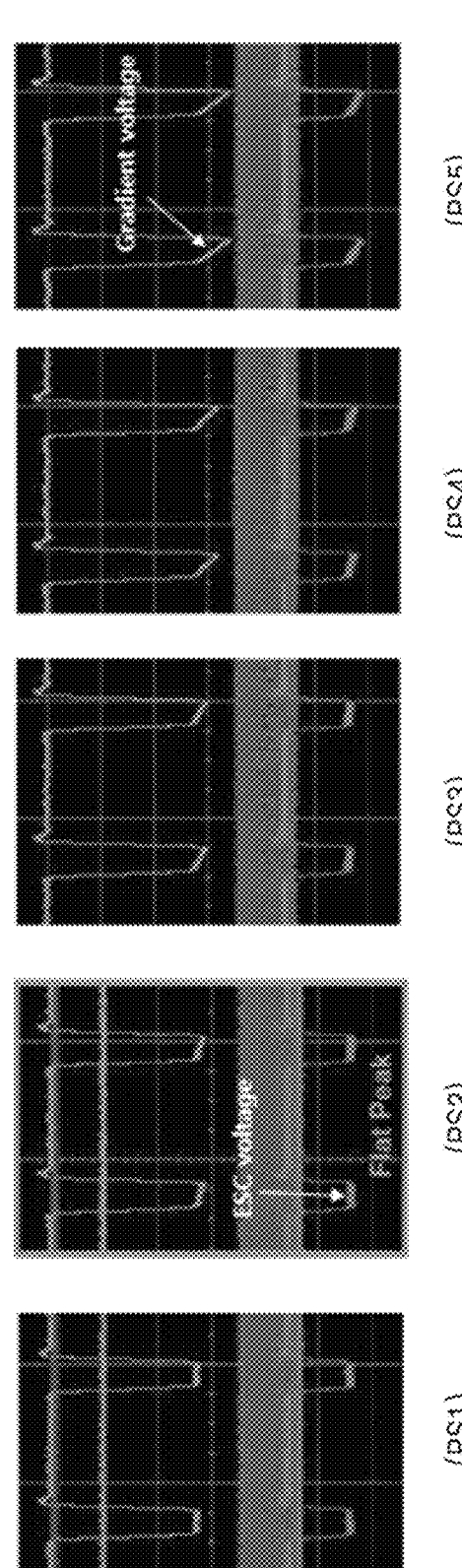
FIG. 10 illustrates voltages induced to a substrate when bias voltages having voltage waveforms in FIG. 9 are applied, according to an embodiment.
Figures 11A, 11B:
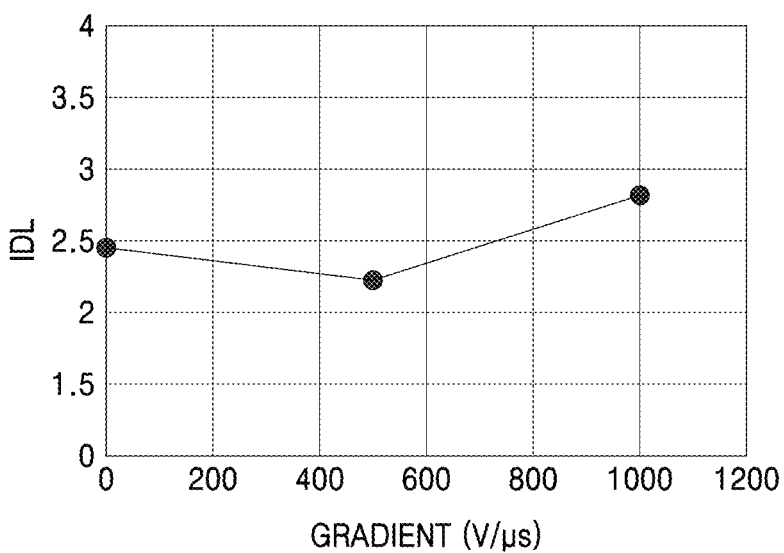
FIG. 11A is a graph of an etching distribution for cases in FIG. 10, according to an embodiment.
FIG. 11B is a table of an etching distribution result of FIG. 11A, according to an embodiment.

FIG. 9 is a graph of voltage waveforms of non-sinusoidal waves having different slopes in the ramp period T2b, according to an embodiment. FIG. 9 illustrates a first ramp slope case PS1 in which a slope absolute value of the ramp period T2b is 400 V/μs, a second ramp slope case PS2 in which a slope absolute value of the ramp period T2b is 500 V/μs, a third ramp slope case PS1 in which a slope absolute value of the ramp period T2b is 600 V/μs, a fourth ramp slope case PS4 in which a slope absolute value of the ramp period T2b is 800 V/μs, and a fifth ramp slope case PS5 in which a slope absolute value of the ramp period T2*b* is 1000 V/μs. FIG. 10 illustrates voltages induced to the substrate WF on the lower electrode structure 120, when bias voltages having voltage waveforms corresponding to the first through fifth ramp slope cases PS1 through PS5 in FIG. 9 are applied, according to an embodiment. FIG. 11A is a graph of an etching distribution for the first through fifth ramp slope cases PS1 through PS5 in FIG. 10, according to an embodiment, and FIG. 11B is a table of an etching distribution result of FIG. 11A, according to an embodiment. In FIG. 11A, the X-axis may represent a slope of the ramp period T2*b*, and the Y-axis may represent an intra-cell depth loading (IDL) according to the slopes of the ramp period T2*b*.

Referring to FIGS. 9 and 10, it may be identified that the voltage induced to the substrate WF has a constant value when the absolute value of the slope in the ramp period T2*b* is 500 V/μs (the second ramp slope case PS2). In addition, referring to FIGS. 9, 11A, and 11B, in the second ramp slope period case PS2, it may be identified that the value of the IDL is lowest (that is, the etching distribution is good). Based on the results described above, it may be identified that when an etching process is performed by using a bias voltage of a voltage waveform having a slope value of a ramp period such that a voltage induced to the substrate WF has a constant value, the etching distribution may be improved.

While the disclosure has been particularly shown and described with reference to embodiments thereof, it will be understood that various changes in form and details may be made therein without departing from the spirit and scope of the following claims and their equivalents.

What is claimed is:

1. A voltage waveform control method comprising:

generating a voltage waveform of a non-sinusoidal wave, the voltage waveform comprising a pulse period having a positive bias voltage, a ramp period having a negative bias voltage, a first transition period changing from the pulse period to the ramp period, and a second transition period changing from the ramp period to the pulse period;

adjusting a length of a negative voltage period having the negative bias voltage during a period of the voltage waveform to be at most 20% of a total length of the period of the voltage waveform;

adjusting a slope of the ramp period; and outputting an adjusted voltage waveform based on the adjusted length of the negative voltage period and the adjusted slope of the ramp period, wherein the adjusting the length of the negative voltage period comprises adjusting a length of the first transition period and a length of the second transition period.

2. The method of claim 1, wherein a sum of the length of the first transition period and the length of the second transition period is at most 1.5 times a length of the ramp period.

3. The method of claim 1, wherein the length of the first transition period is adjusted by varying a slope of the first transition period, and the length of the second transition period is adjusted by varying a slope of the second transition period.

4. The method of claim 1, wherein an absolute value of a slope of the first transition period is the same as an absolute value of a slope of the second transition period.

5. The method of claim 1, wherein a slope of the ramp period is adjusted to maintain a constant value of the slope.

6. The method of claim 1, wherein the voltage waveform has a frequency selected from a range of 100 KHz to 1 MHz.

7. The method of claim 1, wherein the slope of the ramp period is a negative slope.

8. A substrate processing method comprising:

providing a substrate on a lower electrode structure inside a chamber, the substrate having an etching mask arranged on an upper surface of the substrate;

generating plasma in a processing space inside the chamber by applying a plasma voltage to an upper electrode structure;

generating a voltage waveform of a non-sinusoidal wave, the voltage waveform comprising a pulse period having a positive bias voltage, a ramp period having a negative bias voltage, a first transition period changing from the pulse period to the ramp period, and a second transition period changing from the ramp period to the pulse period;

adjusting a length of a negative voltage period having the negative bias voltage during a period of the voltage waveform to be at most 20% of a total length of the period of the voltage waveform;

adjusting a slope of the ramp period; and applying an adjusted voltage waveform, based on the adjusted length of the negative voltage period and the adjusted slope of the ramp period, to the lower electrode structure, wherein the adjusting the length of the negative voltage period comprises adjusting a length of the first transition period and a length of the second transition period.

9. The method of claim 8, wherein a sum of the length of the first transition period and the length of the second transition period is at most 1.5 times a length of the ramp period.

10. The method of claim 8, wherein the length of the first transition period is adjusted by varying a slope of the first transition period, and the length of the second transition period is adjusted by varying a slope of the second transition period.

11. The method of claim 8, wherein an absolute value of a slope of the first transition period is the same as an absolute value of a slope of the second transition period.

12. The method of claim 8, wherein the length of the first transition period and the length of the second transition period are adjusted based on selectivity of the etching mask with respect to the substrate.

13. The method of claim 8, wherein the slope of the ramp period is adjusted based on a voltage induced to the substrate.

14. The method of claim 8, wherein the slope of the ramp period is adjusted to maintain a voltage induced to the substrate at a constant value.

15. The method of claim 8, wherein the slope of the ramp period is adjusted to maintain a constant value of the slope.

16. The method of claim 8, wherein the slope of the ramp period is a negative slope.

17. The method of claim 8, wherein the plasma voltage applied to the upper electrode structure is a radio frequency (RF) voltage.

18. The method of claim 8, wherein the generating the voltage waveform of the non-sinusoidal wave comprises determining the positive bias voltage and the negative bias voltage.

19. The method of claim 8, further comprising monitoring the voltage waveform of the non-sinusoidal wave.

\* \* \* \* \*